Dec. 26, 1967 E. K. HOWELL 3,360,713

POWER CONTROL CIRCUITS USING BI-DIRECTIONAL CONTROLLABLE SEMICONDUCTOR SWITCHING DEVICES

Filed Feb. 7, 1964

2 Sheets-Sheet 1

INVENTOR.
E. KEITH HOWELL
BY Melvin M. Goldenberg
ATTORNEY

INVENTOR.
E. KEITH HOWELL
BY Melvin M. Goldenberg
ATTORNEY

United States Patent Office 3,360,713
Patented Dec. 26, 1967

3,360,713

POWER CONTROL CIRCUITS USING BI-DIRECTIONAL CONTROLLABLE SEMICONDUCTOR SWITCHING DEVICES

Edward Keith Howell, Skaneateles, N.Y., assignor to General Electric Company, a corporation of New York Filed Feb. 7, 1964, Ser. No. 343,299
8 Claims. (Cl. 323—22)

This invention relates to circuitry for controlling the supply of power to a load. More particularly, the invention relates to such circuits employing bi-directional current conducting semiconductor devices.

It is an object of the present invention to provide improved power control circuitry exhibiting the characteristics of low cost, small size, and high reliability.

From an operational standpoint, the merit of a power control circuit is a function of the manner in which it performs while accomplishing desired objectives. Since power control circuits are used to control the amount of power delivered to a load, the accuracy with which the power control circuit responds to input stimuli to effect the desired power control function is of extreme importance.

Thus, it is another object of the present invention to provide improved power control circuitry which accurately responds to input stimuli.

In addition to accuracy of response to input stimuli, the particular nature of the required stimulus is important. Thus, it is most desirable to effect control over a maximum amount of supplied energy with a minimum amount of power dissipation in the control circuitry. Power dissipation may be attributed to both the particular components employed and to the number of such components required.

Therefore, another object of the present invention is to provide circuitry that is operative in response to low power control signals to effect control over the supply of relatively large amounts of energy.

Still another object of the invention is to provide power control circuitry using a minimum number of components and wherein each of said components is characterized by relatively low power consumption.

The relatively recent development of semiconductor devices has provided a new dimension in the area of electrical equipment reliability, size, and power consumption. In the power supply and control field, the silicon controlled rectifier has provided particular advantages. Silicon controlled rectifiers are basically three-terminal semiconductor rectifiers operative to switch from a high to a low impedance state between two main terminals in response to a relatively short impulse on a gate terminal. To control the supply of alternating current power, two such devices, connected with opposing orientations, are generally interposed between the supply and a load. Control circuitry is used to selectively deliver independent triggering pulses to each device in accordance with a desired operating scheme. To reduce the cost and complexity of such arrangements, one of these controlled rectifiers may be eliminated by using a bridge circuit wherein four conventional rectifiers provide the bridge and a single controlled rectifier is connected across its output. Even though this technique reduces the required number of controlled rectifiers and perhaps the complexity of the triggering circuitry, it does so at the expense of added conventional rectifiers and added power loss in these rectifiers.

The invention of controlled bi-directional current conducting semiconductors has provided the answer to the need for simple control over the delivery of alternating current power. These semiconductors normally exhibit a high impedance characteristic between two main current carrying terminals. When a relatively low power triggering impulse is applied to a third or gate terminal, the device switches to a second state wherein a low impedance exists between the current carrying terminals. These semiconductors are bilateral in nature and permit current conduction in either direction with equal facility. Furthermore, the triggering impulses required to effect switching from a high to a low impedance state may generally be of either polarity. Obviously, the bilateral characteristic of the main current conducting path and the flexibility offered by the permissible forms of triggering impulses render the bi-directional current conducting semiconductors admirably suited for control of alternating current.

Another object of the present invention is to provide power control circuits employing bi-directional current conducting semiconductors.

Generally speaking and in accordance with the invention there are provided in combination a bi-directional current conducting semiconductor device which normally exhibits a high impedance characteristic between two main current carrying terminals thereof and which normally exhibits a low impedance characteristic in response to the application of a control signal which has at least a predetermined amplitude to a third and gating terminal thereof, means connecting the semiconductor device in the aforesaid two terminal current carrying path to a load and an alternating current source and pulse generating means in circuit with the third terminal for producing the control signal during each half cycle of output from the source and in synchronism and in varying phase relationship with such output.

The invention is set forth with particularity in the appended claims. The invention itself, however, both as to its organization and method of operation together with further objects and features thereof, may best be understood by reference to the following description taken in conjunction with the accompanying drawings wherein:

FIGS. 1A, 1B, and 1C illustrate respectively: a diagrammatic representation of one form of controlled bi-directional current conducting semiconductor, a symbolic representation for such a device, and typical characteristic operating curves of such a device;

A general understanding of bi-directional current conducting semiconductors is required in order to understand and appreciate the invention as embodied in the illustrative circuits described hereinafter. Broadly speaking, these three terminal devices can be constructed to furnish four modes of operation. The modes of operation differ in the direction of current flow between the main current conduction carrying terminals of the device and in the direction of current flow into the trigger terminal of the device in order to initiate its switching. If the device is arbitrarily designated as having main current carrying terminals 1 and 2 and a gate terminal 3, the following table may be developed to represent the four modes of operation. In the table $V_2$ is considered positive if terminal 2 is more positive than terminal 1, and $I_3$ is considered positive if current flows into gate terminal 3.

| Mode | $V_2$ | $I_3$ (for turn on) |
|---|---|---|
| 1 | + | + |
| 2 | − | − |
| 3 | + | − |
| 4 | − | + |

An examination of the above table makes it apparent that the devices may be switched to their low impedance state in either direction of conduction by triggering impulses of either polarity. The devices may be selectively constructed in order to furnish operation in any modes that are desired. Thus, for example, if it is wished to provide a device operative in the second and third mode, current conduction in either direction through the device may be triggered by impulses having a negative polarity only. On the other hand, if it is desired to operate only in the first and second mode, triggering impulses having a polarity unique to a single direction of conduction may be required.

Figure 1A:
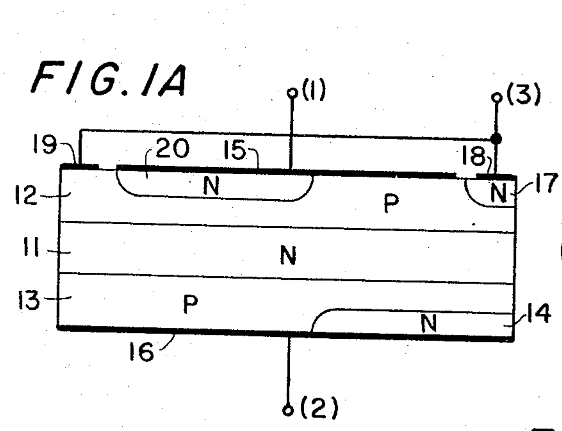
Figure 1B:
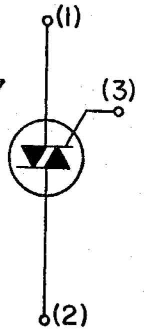

An example of the structure of a typical bi-directional current carrying semiconductor is shown in FIG. 1A. This particular structure has been shown and described in detail in the co-pending patent application of F. W. Gutzwiller, Ser. No. 331,776, filed Dec. 19, 1963 now Patent No. 3,275,909, issued on Sept. 27, 1966, and assigned to the General Electric Company, assignee of the present invention. Although this particular device is primarily designed to function in the modes 1 and 2 set forth in the above table, operation in modes 3 and 4 is also possible. Accordingly, when current carrying terminal 2 is positive with respect to current carrying terminal 1, the device is switchable to a low impedance state by the application of a current into gate terminal 3. When the reverse polarity is applied between the main terminals 1 and 2 the device is switchable to a low impedance state by extracting gate current from gate terminal 3. Stated another way, conduction from terminal 2 to terminal 1 may be initiated by the application of a positive gating pulse to terminal 3 and conduction from terminal 1 to terminal 2 may be initiated by the application of a negative triggering pulse to terminal 3.

Considering the device of FIG. 1A more specifically, it may be considered to be a multi-layer device having an internal layer 11 of n conductivity type sandwiched by p conductivity type region 12 and 13. The two p-type layers 12 and 13 perform different functions for conduction in opposite directions through the device. For example, when the upper terminal 1 is positive relative to lower terminal 2, p-type layer 12 operates as an emitter and the p-n junction between layers 12 and 11 is considered an emitter junction. Under these conditions, the p type layer 13 constitutes a base region which is separated by the n-p junction between layers 11 and 13. When the polarity between the main terminals 1 and 2 is reversed, p type layer 13 constitutes an emitter and p type layer 12 constitutes an internal base layer.

An n conductivity region 14 is formed adjacent or contiguous with the portion of the p conductivity region 13. When terminal 1 is positive relative to terminal 2, n type region 14 constitutes an emitter region and the n-p junction between it and p type region 13 constitutes an emitter junction. In order to provide a corresponding emitter and emitter junction for conduction in the opposite sense, when terminal 2 is positive, an n conductivity type region 20 is formed adjacent or contiguous with a part of p layer 12 providing a p-n emitter junction for conduction of this polarity. The n type region 20 is only contiguous with a part of the p type region 12 and is spaced from the sides of the device to leave exposed surfaces of the p region 12 on both sides.

Electrical contacts for the main current conduction path through the device are provided by low resistance ohmic contacts 15 and 16 on the major faces of the device. Electrode or contact 15 contacts the external n type region 20 and the exposed portion of the next adjacent p type layer 12, thereby shorting the p-n junction therebetween. Electrode 16 extends over the external n layer 14 and the exposed portion of the p type layer 13 and thereby shorts the p-n junction therebetween. As shown in the figure, electrodes 15 and 16 are utilized to obtain terminals 1 and 2 of the device respectively.

It may be helpful to note that the device as thus far described constitutes a five layer semiconductor with shorted emitters and is essentially the five layer, two-terminal bilateral switch described in the co-pending patent application of Holonyak et al., Ser. No. 838,504, filed Sept. 8, 1959, and assigned to the General Electric Company, assignee of the present invention.

In order to establish control over the conduction between terminals 1 and 2 of the device in FIG. 1A, two gate connections are provided. First, an n conductivity type region 17 is established to the portion of p type layer 12 near the main electrode 15. A low resistance ohmic contact or electrode 18 is formed on this gate region and gate terminal 3 is connected thereto. Another ohmic contact is established with p type layer 12 at a point electrically isolated from the junction between layers 17 and 12. This second ohmic contact, exemplified by electrode 19, is also connected to terminal 3. The object in making the two connections remote is to provide a relatively high resistance between them and thus reduce any electrical shorting. Since the distance from gate electrode 19 through p type region 12 under the external n type region 20 to the portion of main electrode 15 on region 12 is sufficient to provide a high resistance path, the two electrodes 18 and 19 are electrically remote.

A general understanding of the operation of the semiconductor device shown in FIG. 1A will be available if one considers the device as being made up of two portions: the first portion comprising, electrodes 15 and 19, n type layer 20, p type layer 12, n type layer 11, p type layer 13, and electrode 16; and the second comprising, electrodes 15 and 18, n type layer 17, p type layer 12, n type layer 11, p type layer 13, n type layer 14, and electrode 16. With this hypothetical division of the device, it will be appreciated that the first portion represents a standard type silicon controlled rectifier and its functioning may be considered analogous to such a device. The second portion represents a remote gate silicon controlled rectifier and its functioning is analogous to such a device. The operation and functioning of silicon controlled rectifiers is fully set out in numerous publications including the General Electric Controlled Rectifier Manual, second edition, Copyright 1961 by the General Electric Company. The operation and functioning of the remote gate silicon controlled rectifier is fully described and illustrated in the co-pending patent application of F. E. Gentry et al., Ser. No. 326,162, filled Nov. 26, 1963 now Patent No. 3,284,680, issued on Nov. 8, 1966, and assigned to the General Electric Company, assignee of the present invention. A still more complete consideration of the device is available in the aforecited patent application of F. W. Gutzwiller.

Figure 1C:
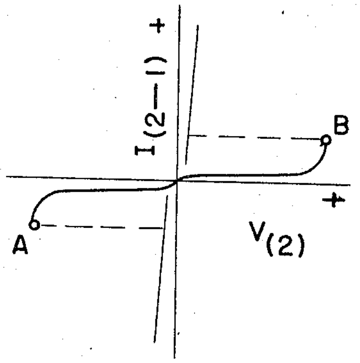

The operation of the device may briefly be considered in conjunction with the typical characteristic curves shown in FIG. 1C. These curves illustrate the current flow through terminals 1 and 2 as ordinates and voltage on the main terminals as abscissae.

When terminal 2 is positive relative to terminal 1, the two outer layers of the device in FIG. 1A tend to conduct because the p-n junctions between layers 13 and 11 and 12 and 20 respectively are forward biased. On the other hand, the center n-p junction between layers 11 and 12 tends to block current flow through the device. This blocking condition may be removed by either raising the total voltage across the junction to a sufficiently high value to force conduction thereacross, or by introducing a sufficient amount of current through the gate terminal 3 and electrode 19 to cause a change in the charge condition across the junction. In operation, this is effectively what is done. Without going into a detailed recitation of the movement of charges within the device, it suffices to say that when sufficient gate current is supplied thereto the space charge at the blocking n-p junction between layers 11 and 12 collapses and within a short while, the device presents a low impedance path for current flow from terminal 2 to terminal 1.

This condition is illustrated in the first quadrant of the characteristic curves of FIG. 1C. Thus, when the voltage on terminal 2 is positive an increase in the voltage does not tend to increase current until a "breakover voltage" and "breakover current" at point B is attained at which avalanche multiplication begins. Beyond this point the current increases rapidly until the center junction between layers 11 and 12 becomes forward biased and at that time the semiconductor goes into a high conduction region. For increasing magnitudes of gate current into terminal 3, the magnitude of the breakover voltage is reduced.

When the voltage on terminal 1 is positive with respect to the voltage on terminal 2 the device in FIG. 1A operates in a somewhat different fashion but is again responsive to a gating impulse on terminal 3 to assume a high conduction state and in fact provides a mirror image of the type of operation previously described.

The application of a positive potential on terminal 1 with respect to terminal 2 tends to make the p-n junctions between layers 12 and 11 and 13 and 14 conductive. At the same time, the n-p junction between layers 11 and 13 tends to block current flow through the device. Once again, it will be appreciated that in order to overcome this blocking condition it is necessary to either raise the voltage across the junction to a high enough value to force conduction thereacross or to extract current from gate terminal 3 in order to change the charge condition appearing across this junction.

The third quadrant of the characteristic curve shown in FIG. 1C illustrates device operation under the last mentioned condition. Once again it will be seen that increasing the voltage between terminals 1 and 2 has little effect until a breakover point occurs at which time the current begins to increase, charges are redistributed within the various layers of the device, and finally the avalanche condition occurs wherein a high current is conducted between terminals 1 and 2. In effect, therefore, the device will be seen to exhibit bidirectional current conducting characteristics and is operative under the control of appropriate polarity triggering impulses on terminal 3 to selectively furnish a low impedance path between terminals 1 and 2.

Figure 2:
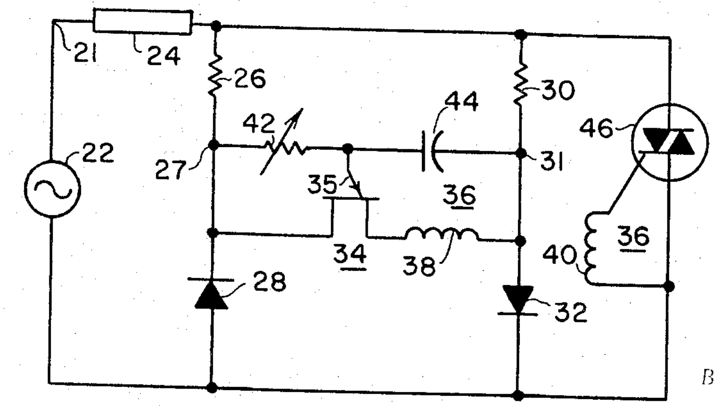
FIG. 2 is a schematic depiction of an illustrative embodiment of a circuit constructed in accordance with the principles of the invention.

Referring now to FIG. 2 wherein there is shown an illustrative embodiment of a circuit in which the gating of the bi-directional semiconductor switching device can be phase controlled to control the application of an A.C. source potential to a load, the output from an A.C. source 22 is applied through a load 24 across the series arrangement of a resistor 26 and the cathode to anode path of a diode 28 and across the series arrangement of a resistor 30 and the anode to cathode path of a diode 32. Connected between diodes 28 and 32 is the series combination of the base to base path of a unijunction transistor 34 and the primary winding 38 of a pulse transformer 36. The emitter 35 of unijunction transistor 34 is connected to the junction 27 of resistor 26 and diode 28 through an adjustable resistor 42 and to the junction 31 of resistor 30 and diode 32 through a capacitor 44. It is seen that resistors 26 and 30 and diodes 28 and 32 comprise a bridge circuit which produces the operating voltages for unijunction transistor 34 and that adjustable resistor 42 enables an operator to adjust or control the time at which the voltage at capacitor 44 reaches the firing point of unijunction transistor 34.

The bi-directional semiconductor device 46 is serially connected by its two main current carrying terminals to source 22. A secondary winding 40 of pulse transformer 36 is connected between one of its main current carrying terminals and its gating terminal.

In the operation of the circuit of FIG. 2, if it is assumed that the positive half cycle of supply voltage is appearing at terminal 21, capacitor 44 charges in the positive direction through resistor 42. The time that the firing point of unijunction transistor 34 is attained, i.e., the voltage at emitter 35, is determined by the time constant of adjustable resistor 42 and capacitor 44. When unijunction transistor 34 fires, whereby capacitor 44 is permitted to discharge therethrough, a positive pulse appears at the dot end of the windings of transformer 36 and consequently, producing a gating current in the gate terminal of semiconductor device 46 which triggers it into conduction. The remainder of the positive half cycle of output from source 22 appears substantially fully across load 24. Now on the negative half cycle of output from A.C. source 22, i.e., when the negative half cycle appears at terminal 21, the presence of diode 28 again permits capacitor 44 to charge in the positive direction and consequently at the time that the charge on capacitor 44 attains the firing voltage for unijunction transistor 34, a positive pulse again appears at the dot end of the windings of pulse transformer 36 and semiconductor device 46 is again gated into conductivity. It is accordingly seen that in the operation of the circuit of FIG. 2, diodes 28 and 32 effect the full wave rectification of the output from source 22, and the positive charging of capacitor 44 on each half cycle of output from source 22. Resistors 26 and 30 cause the providing of a relatively low voltage across the base to base path of the unijunction transistor, i.e., from junction 27 to junction 31. Semiconductor device 46 reverts to is blocking state at the end of the half cycle, i.e., when the output current from source 22 passes through the zero crossover point. Pulse transformer 36 in the circuit of FIG. 2 provides the required isolation between the semiconductor device's gating terminal and the gating circuit therefor.

Figure 3:
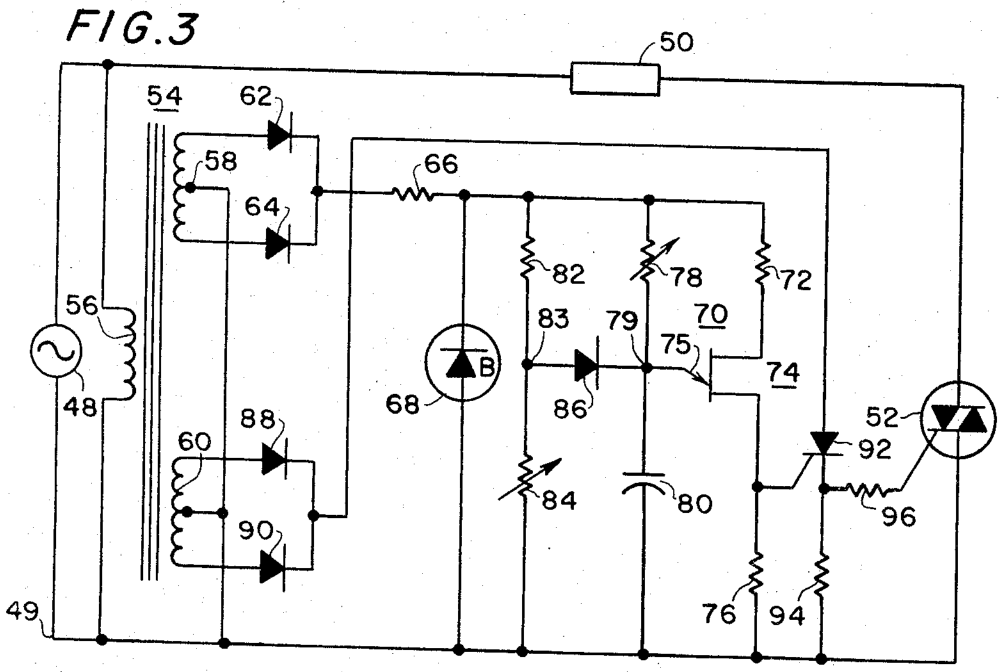
FIG. 3 is a circuit schematic similar to that of FIG. 2 particularly useful for supplying inductive loads.

The circuit of FIG. 2 is effective for controlling the A.C. voltage applied to a load particularly when the load is essentially of a resistive nature. Since the gating of the semiconductor device may require that a holding current be established within a finite period of time, such as a few microseconds, where the circuit load is of the inductance type, there may be required the use of a gating signal which persists long enough for the load current to rise above the holding current of semiconductor device 46. The circuit of FIG. 3 is one which can be advantageously utilized where the circuit load is of an inductive nature.

In the latter circuit, it is seen that a load 50 having an inductive component serially connects the main current carrying two terminal path of semiconductor device 52 to an A.C. source 48. Connected across source 48 is a transformer 54 having a primary winding 56 and center tapped secondary windings 58 and 60. The output appearing across secondary winding 58 is full wave rectified by diodes 62 and 64. This full wave rectified output is passed through a resistor 66 and applied across the cathode to anode path of a breakdown diode 68 which has its anode connected to terminal 49 of source 48. The consequent regulated voltage appearing across breakdown diode 68 functions as the supply voltage for a unijunction transistor oscillator 70.

Unijunction transistor oscillator 70 comprises a series arrangement of a resistor 72, the base to base path of a unijunction transistor 74 and a resistor 76 across which the output of oscillator 70 is developed. The emitter 75 of unijunction transistor 74 is connected to the cathode end of diode 68 through an adjustable resistor 78 and to terminal 49 through a capacitor 80. The voltage appearing across breakdown diode 68 is also applied across a voltage divider comprising a resistor 82 and an adjustable resistor 84. The junction 83 of resistor 82 and adjustable resistor 84 is connected to the junction 79 of adjustable resistor 78 and capacitor 80 through the anode to cathode path of a diode 86.

The output appearing across secondary winding 60 is full wave rectified by diodes 88 and 90 and this full wave rectified output is applied to the anode of a silicon controlled rectifier 92. The cathode of silicon controlled rectifier 92 is connected to terminal 49 through a resistor 94. The output of unijunction transistor oscillator 70 appears across resistor 76 and is applied to the gate electrode of silicon controlled rectifier 92. The output appearing at the cathode of silicon controlled rectifier 92 is applied to the gating terminal of semiconductor device 52 through a resistor 96.

In the operation of the circuit of FIG. 3, unijunction transistor 74 is, of course, fired when the voltage across capacitor 80 attains the firing point for the transistor. When the value of resistor 78 is chosen to be small, capacitor 80 charges to the firing voltage essentially through this resistor. For large values of resistor 78, capacitor 80 is initially charged rapidly through resistor 82 and diode 86 to a voltage determined by the relationship of resistors 82 and 84, thence charged more slowly through resistor 78 to the firing voltage of transistor 74. With the arrangement of resistors 78, 82, and 84, capacitor 80 and diode 86, two dynamically interrelated time constant circuits are provided for charging capacitor 80. Consequently, there is enabled a wide range of phase control of the triggering circuit for semiconductor device 52 in response to relatively small changes in magnitude of resistor 84.

When silicon controlled rectifier 92 is gated into conductivity as a result of the firing of unijunction transistor 74, the output at its cathode provides the gating signal for semiconductor device 52, which persists for essentially the remainder of the half cycle in which it is initiated.

It is to be noted in the operation of the circuit of FIG. 3 that the triggering of silicon controlled rectifier 92 is controlled by a unijunction transistor oscillator circuit which is controlled in turn by a unique firing arrangement consisting of a ramp and pedestal waveshape. The firing of the unijunction transistor as shown in FIG. 3 may be effected directly from and synchronized with the supply voltage and consequently, current through the load may be controlled through the full range. If the output of unijunction transistor 74 gates silicon controlled rectifier 92 into conductivity before load current passes through the zero crossover point, the transition of load current from one polarity to the opposite polarity is smooth and continuous through semiconductor device 52. Thus, the circuit of FIG. 3 enables the phase control of inductive loads by the use of a silicon controlled rectifier which may have a low voltage and low current rating for providing the desired gating signal for the main current handling semiconductor device 52. It will also be recognized that rectifiers 62 and 64 may also supply power to the silicon controlled rectifier, instead of rectifiers 88 and 90.

Figure 4:
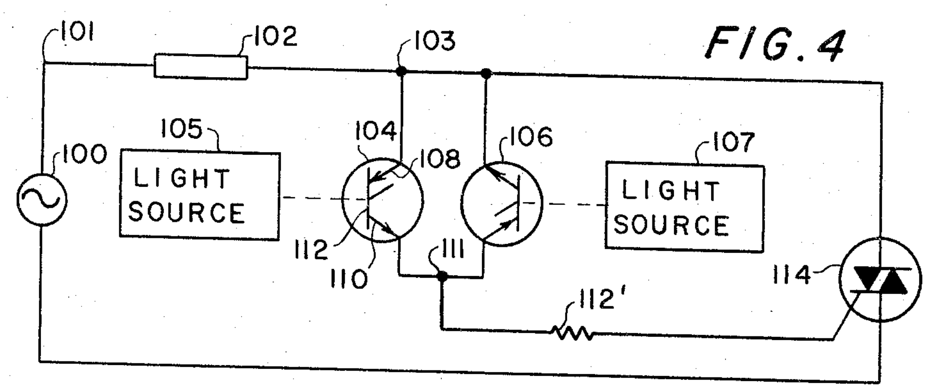
FIG. 4 is a circuit schematic of an alternative embodiment of a circuit constructed in accordance with the invention and employing a pair of light actuated PNPN switches.

In FIG. 4 there is shown a circuit constructed in accordance with the principles of the invention wherein the phase controlled triggering of the bi-directional semiconductor main current handling device is provided by the use of light actuated switches. The light actuated switches 104 and 106 in the circuit of FIG. 4 are silicon PNPN devices which, when subjected to radiant light, switch from the blocking to the conducting state. A light actuated switch such as switch 104, for example, comprises an anode 108, a cathode 110, and an active surface 112. When light is permitted to impinge on active surface 112, switch 104 is placed into its low impedance, i.e., conductive state, whereby in the circuit of FIG. 4, at the time that the positive half cycle appears at terminal 101, current is permitted to flow from load 102 through it and resistor 112′ to the gating terminal of bi-directional semiconductor device 114 whereby the output of the source 100 may be substantially fully applied to load 102. Since a light actuated switch such as either switch 104 or 106 is a unidirectional device, to effect the supply of gating signals to semiconductor device 114 during each half cycle of output from source 100, switches 104 and 106 have to be connected in opposite polarities between points 103 and 111. Each of switches 104 and 106 have respectively associated therewith light sources 105 and 107, each of which may suitably include both a source of radiant light energy and means whereby the energy from the light reaches a threshold level for triggering the light activated switches at different points in the half cycle to provide for phase control of semiconductor 114.

Figure 5:
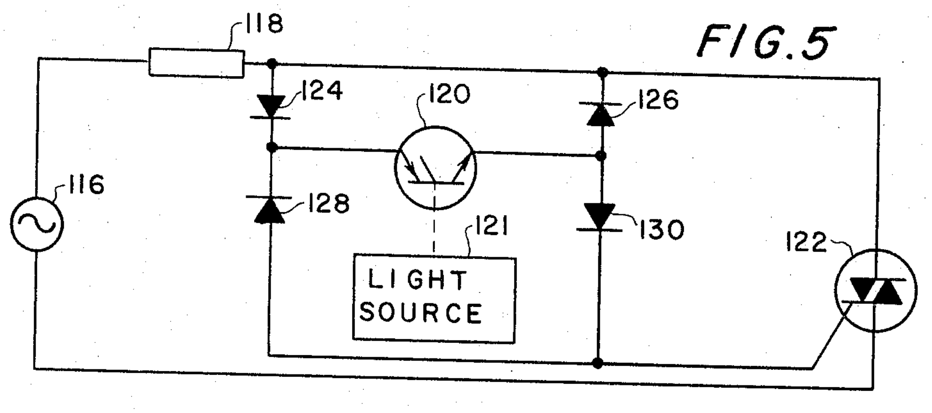
FIG. 5 is a diagram of a circuit similar to that of FIG. 4 and employing a single light actuated switch.

In FIG. 5 there is shown a circuit similar to that of FIG. 4 wherein a single light actuated switch 120 may be utilized for gating the semiconductor device 122 on both polarities of supply voltage. In this circuit, diodes 124, 126, 128, and 130 comprise a full wave bridge rectifier whereby on each half cycle of output from source 116, light actuated switch 120 may be switched to its conducting state. Here again, the phase control of the load current through bi-directional semiconductor device 122 may be obtained by utilizing a light source 121 that is pulsed at a controllable phase angle.

Figure 6:
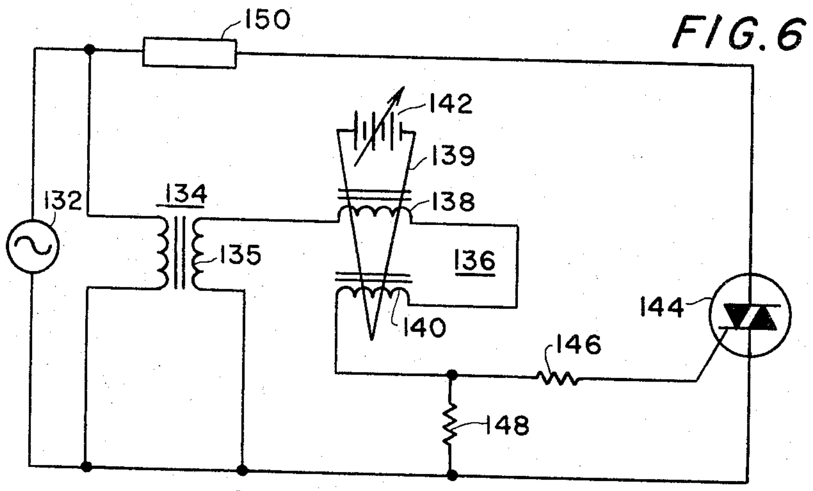
FIG. 6 is a circuit schematic of another embodiment of a circuit constructed in accordance with the invention and employing a saturable inductive device.

In FIG. 6, there is shown a phase control circuit constructed in accordance with the principles of the invention utilizing a saturable reactor as the intermediate triggering device for the gating terminal of the main current bi-directional semiconductor device. In this circuit, a portion of the A.C. supply from source 132 is provided across the secondary winding 135 of transformer 134 connected across source 132. This voltage appearing on secondary winding 135 is applied to the gate windings 138 and 140 of a saturable device 136. The control winding 139 of saturable device 136 is suitably connected to a source of unidirectional potential shown as a battery 142 which provides a biasing signal for saturable device 136 and thereby enables the control of the point in the half cycle at which semiconductor device 144 is gated into conductivity. The saturable reactor gate windings are connected to the gating terminal of semiconductor device 144 through a current limiting resistor 146, the gating signal for semiconductor device 144 being developed across a resistor 148.

In the operation of the circuit of FIG. 6, it is seen that the cores of saturable device 136 are driven in one direction of saturation during one half cycle of output from secondary winding 135 and driven in the opposite direction of saturation during the other half cycle of output appearing in secondary winding 135. The point at which these respective saturations occur, i.e., when gating pulses are permitted to be applied to semiconductor device 144 depends on the volt-second characteristics of the saturable reactor cores and the value of the unidirectional potential biasing signal. Transformer 134, of course, enables synchronization of the saturable reactor firing with the output from source 132. The circuit of FIG. 6 is an illustration of the use of an isolated D.C. control signal for the phase controlling of the gating of semiconductor device 144 through a saturable device operated from a low voltage supply. The phase angle at which conduction is initiated in semiconductor device 144 is determined by the magnitude of the D.C. control signal. Since the gate current is provided by the output of saturable device 136, once saturation has been attained, it persists the remainder of each half cycle thereafter. Accordingly, the circuit of FIG. 6 is advantageously used where the load 150 has an inductive component.

Figure 7:
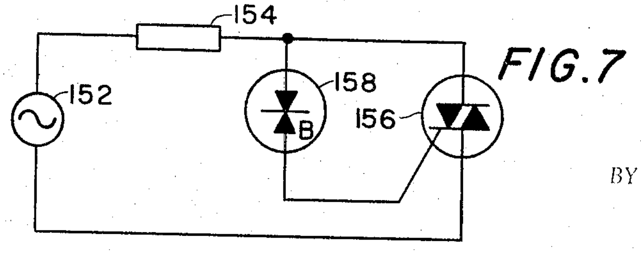
FIG. 7 is a schematic depiction of a further embodiment of the invention employing a double anode breakdown diode.

In FIG. 7, there is shown a circuit in which a double anode breakdown diode 158 may be utilized to provide a control triggering for the main current handling semiconductor device 156 at a specified supply voltage. Thus, depending on the value of the supply voltage from source 152, diode 158 will break down at different points of the half cycles of output from source 152 to control conduction of semiconductor device 156. Thus, when supply voltage is low, diode 158 will not break down, semiconductor device 156 remains nonconductive, and the supply voltage, accordingly, will not be supplied to load 154. In the presence of an overvoltage, diode 158 will break down at the peak of the half cycle, or earlier, whereby the supply voltage will be substantially applied to the load for one half or more of each half cycle.

While there have been described what are considered to be the preferred embodiments of this invention, it will be obvious to those skilled in the art that various changes and modifications may be made therein, and it is, therefore, aimed in the appended claims to cover all such changes and modifications as fall within the spirit and scope of the invention.

What is claimed as new and desired to be secured by Letters Patent of the United States is:

1. In combination, a bi-directional conducting semiconductor device normally exhibiting a high impedance characteristic between two main current carrying terminals thereof and exhibiting a low impedance characteristic in response to the application of a control signal having at least a predetermined amplitude to a third and gating terminal thereof, the minimum value of said signal necessary to cause low impedance being the same for both directions of current between said two terminals, means for connecting said two main terminals in a current carrying path to a load and an alternating current source, a relaxation oscillator adapted to be connected in circuit to said source and having an output connected between said third terminal and the same one of said main terminals for both directions of current flow between said two main terminals for providing to said third terminal control pulses during each half cycle of said output from the alternating current source and in a varying phase relationship with said output.

2. The combination defined in claim 1 wherein said relaxation oscillator comprises a rectifier for rectifying the voltage from said source, a unijunction transistor having a pair of bases and an emitter, an adjustable time constant circuit associated with said emitter, and means for applying said rectifier voltage to said transistor in its base to base path and to said time constant circuit.

3. In combination, a bi-directional current conducting semiconductor device normally exhibiting a high impedance characteristic between two main current carrying terminals thereof and exhibiting a low impedance characteristic in response to the application of a control signal having at least a predetermined amplitude to a third and gating terminal thereof, the minimum value of said signal necessary to cause low impedance being the same for both directions of current between said two terminals, means serially connecting said two main terminals in a current carrying path to a load and an alternating current source, and means for producing first and second rectified portions of said source output, a unijunction transistor relaxation oscillator including a unijunction transistor having a pair of base electrodes and an emitter electrode, an adjustable time constant circuit associated with said emitter electrode, means for applying said first rectified portion across the base to base path of said transistor and to said time constant circuit to provide signals occurring in synchronism with and in varying phase relationship with half cycles of the source output, a gate controlled rectifier, having an anode, cathode and gate electrode, means for applying said second rectified portion across the anode to cathode of said gate controlled rectifier, means for applying said signals to said gate electrode to produce said control pulses, and means for applying said control pulses between said third terminal and the same one of said main terminals for both directions of current flow between said two main terminals.

4. In combination, a bi-directional current conducting semi-conductor device normally exhibiting a high impedance characteristic between two main current carrying terminals thereof and exhibiting a low impedance characteristic in response to the application of a control signal having at least a predetermined amplitude to a third and gating terminal thereof, the minimum value of said signal necessary to cause low impedance being the same for both directions of current between said two terminals, means for connecting said two main terminals in a current carrying path to a load and an alternating current source, and pulse generating means comprising a pair of oppositely connected variably light actuated PNPN switches connecting said third terminal to said source and the same one of said main terminals for both directions of current flow between said two main terminals for providing a control signal in synchronism and in varying phase relationship with said source output during each half cycle of said output.

5. In combination, a bi-directional current conducting semi-conductor device normally exhibiting a high impedance characteristic between two main current carrying terminals thereof and exhibiting a low impedance characteristic in response to the application of a control signal having at least a predetermined amplitude to a third and gating terminal thereof, the minimum value of said signal necessary to cause low impedance being the same for both directions of current between said two terminals, a circuit means for connecting said two main terminals in a current carrying path to a load and an alternating current source, pulse generating means comprising rectifying means having a pair of AC input terminals connected to the source output and between said third terminal and the same one of said main terminals for both directions of current flow between said two main terminals, and having a pair of DC output terminals, and an adjustably light actuated switch connected to said rectifying means for producing control pulses in synchronism and in varying phase relationship with the source output during each half cycle of said output.

6. In combination, a bi-directional current conducting semiconductor device normally exhibiting a high impedance characteristic between two main current carrying terminals thereof and exhibiting a low impedance characteristic in response to the application of a control signal having at least a predetermined amplitude to a third and gating terminal thereof, the minimum value of said signal necessary to cause low impedance being the same for both directions of current between said two terminals, means for connecting said two main terminals in a current carrying path to a load and an alternating current source, and pulse generating means comprising a double anode breakdown diode connected between said third terminal and the same one of said main terminals for both directions of current flow between said two main terminals for producing pulses and applying said signals to said third terminal in synchronism and in varying phase relationship with the source output during each half cycle of said output.

7. In combination, a bi-directional current conducting semiconductor device normally exhibiting a high impedance characteristic between two main current carrying terminals thereof and exhibiting a low impedance characteristic in response to the application of a control signal having at least a predetermined amplitude to a third and gating terminal thereof, the minimium value of said signal necessary to cause low impedance being the same for both directions of current between said two terminals, means for connecting said two main terminals in a current carrying path to a load and an alternating current source, and pulse generating means comprising a saturable magnetic device connected between said third terminal and the same one of said main terminals for both directions of current flow between said two main terminals for producing pulses and applying said signals to said third terminal in synchronism and in varying phase relationship with the source output during each half cycle of said output.

8. In combination, a bi-directional current conducting semiconductor device normally exhibiting a high impedance characteristic between two main current carrying terminals thereof and exhibiting a low impedance characteristic in response to the application of a control signal having at least a predetermined amplitude to a third and gating terminal thereof, the minimum value of said signal necessary to cause low impedance being the same for both directions of current between said two terminals, a circuit means for serially connecting said two main terminals in a current carrying path to a load and an alternating current source, and pulse generating means comprising a saturable device including a pair of gate windings and a control winding, said gate windings having an output coupled between a third terminal and the same one of said main terminals for both directions of current flow between said two main terminals, a unidirectional voltage supply in circuit with said control winding whereby there is provided control pulses to said third terminal in synchronism with said source output during each half cycle of the output, the phase relationship between said output and said pulses varying in accordance with the value of said unidirectional supply voltage.

References Cited

UNITED STATES PATENTS 3,146,392 8/1964 Sylvan -------------- 323—22

FOREIGN PATENTS 945,249 12/1963 Great Britain.
657,345 2/1963 Canada.
1,267,417 6/1961 France.

JOHN F. COUCH, *Primary Examiner.*

K. D. MOORE, M. L. WACHTELL, WM. SHOOP, *Assistant Examiners.*